United States Patent [19]

Bartling et al.

[11] Patent Number: 5,065,043

[45] Date of Patent: Nov. 12, 1991

[54] BIASING CIRCUITS FOR FIELD EFFECT TRANSISTORS USING GAAS FETS

[75] Inventors: James E. Bartling, Dallas; Dale A. Heaton, Garland, both of Tex.

[73] Assignee: Texas Instruments Incorporated, Dallas, Tex.

[21] Appl. No.: 491,752

[22] Filed: Mar. 9, 1990

[51] Int. Cl.⁵ .......................... H03K 3/01; H03F 3/45
[52] U.S. Cl. .................. 307/296.8; 307/304; 330/261
[58] Field of Search ............ 307/304, 296.8, 450, 307/568; 330/253, 261, 277, 296

[56] References Cited

U.S. PATENT DOCUMENTS

| | | | |
|---|---|---|---|
| 4,021,747 | 5/1977 | Todokoro | 330/261 |
| 4,471,238 | 9/1984 | Hickling et al. | 307/450 |
| 4,496,909 | 1/1985 | Knapp | 330/296 |
| 4,568,844 | 2/1986 | O'Connor | 307/450 |
| 4,686,387 | 8/1987 | Rumelhard | 307/304 |
| 4,686,451 | 8/1987 | Li et al. | 307/296.8 |
| 4,703,205 | 10/1987 | Heimbigner | 307/296.8 |
| 4,736,153 | 4/1988 | Kogan | 307/296.8 |
| 4,881,046 | 11/1989 | Tung | 330/296 |
| 4,970,471 | 11/1990 | Taylor | 330/296 |

Primary Examiner—Stanley D. Miller
Assistant Examiner—Richard Roseen
Attorney, Agent, or Firm—B. Peter Barndt; James T. Comfort; Melvin Sharp

[57] ABSTRACT

Hysteresis effects in low frequency field effect transistor circuits are minimized by using biasing or clamping circuits including field effect transistors.

11 Claims, 3 Drawing Sheets

BIASING CIRCUITS FOR FIELD EFFECT TRANSISTORS USING GAAS FETS

FIELD OF THE INVENTION

The invention relates to semiconductor circuits, and more particularly to the use of gallium arsenide field effect transistors to improve high frequency operation of silicon transistor circuits such as buffer circuits and differential amplifiers.

BACKGROUND OF THE INVENTION

The transconductance, gate to source voltage vs drain current, of Gallium arsenide (GaAs) transistors changes significant when operated from d.C. to 100 KHZ. GaAs transistors are necessary to improve the high frequency operation of existing silicon transistor circuits, but the GaAs transistor circuits must maintain the same low frequency accuracy of silicon transistor circuits.

Field Effect Transistors (FETS) are voltage controlled current sources, where the drain current ($I_D$) is the current source and the gate to source voltage ($V_{GS}$) is the controlling voltage. For GaAs FETS, the transconductance ($I_D$ versus $V_{GS}$) of the FET changes significantly at low operating frequencies. This is for frequencies from D.C. to approximately 100 KHZ. For high frequency changes, frequencies greater than 100 KHZ, the gain does not change significantly.

In GaAs FETs, when the drain current is held constant, the gate to source voltage will change if the drain to gate voltage of the FET changes at low frequencies. Gate to source follower circuits, such as voltage buffers and drivers, operate at a relatively constant drain current. When the gate to source voltage is held constant, the drain current will change relative to a change in drain to gate voltage at low frequency. FET current sources operate with a constant gate to source voltage.

For other circuits using GaAs FETs, all the bias conditions change with operating frequency. Amplifiers and differential amplifiers are two examples. When the bias conditions change at low frequencies, the transconductance of a circuit using GaAs FETs will change. All the circuits described above will have a change of transconductance when operated at low frequencies. Comparators and logic gates are implemented with some or all the circuits above. For logic gates and comparators, the change in transconductance causes threshold accuracy errors which relate to timing errors. The error is not a simple offset, gain, or nonlinearity error, the error is frequency dependent. For an input that has a random change in operating frequency, the error cannot be predicted. This low frequency dependent transconductance error is know in the industry as hysteresis.

SUMMARY OF THE INVENTION

The invention is a form of biasing circuitry and a method of biasing in amplifiers, such as differential and buffer amplifiers, to minimize hysteresis errors at low frequencies, and for large changes in differential input voltages.

GaAs field effect transistors are used to control the drain to source voltage and gate to source voltage of FETS used in the differential amplifier.

In one embodiment of the invention, the drain to source voltage and gate to source voltage is controlled as well as the drain current. A minimum idle current is maintained for all differential input voltages.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1A:
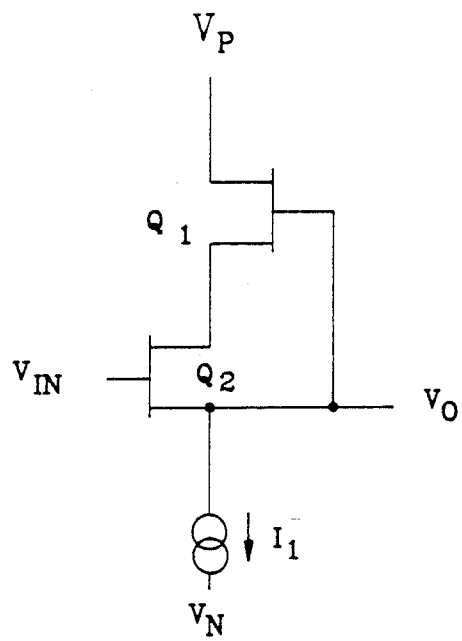
FIG. 1a illustrates a drain to source bias control circuit.

The bias conditions that need to be controlled to minimize hysteresis error at low frequencies are: drain to source voltage; drain to gate voltage; and gate to source voltage. FIG. 1a shows a drain to source bias control circuit. The circuit is configured as a gate to source follower circuit. $Q_2$ is the critical gate to source follower FET. $Q_1$ controls the drain to source voltage of $Q_2$. The source voltage of $Q_2$ is sensed by gate of $Q_1$. The gate to source voltage of $Q_1$ is the drain to source voltage of $Q_2$. The current source of $I_1$ is selected so that the gate to source voltage of $Q_2$ is approximately 0V. $Q_1$ is selected such that the $I_{DSS}$ of $Q_1$ is two times greater than the $I_{DSS}$ of $Q_2$. This guaranties the drain to source voltage of $Q_2$ is positive.

Figure 1B:
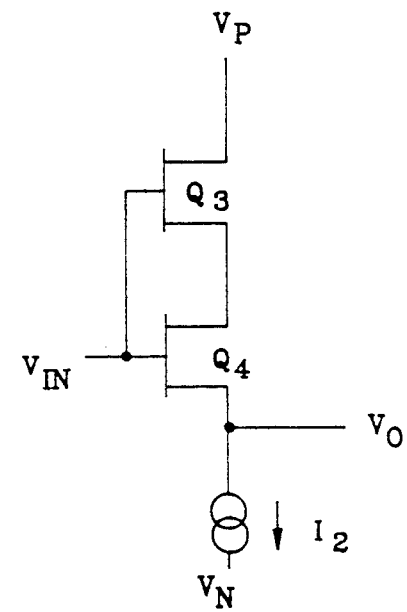
FIG. 1b is a gate to drain bias control circuit.

FIG. 1b shows a gate to drain bias control circuit. Since the gate to source voltage of $Q_4$ is relative constant, the drain to source voltage will also be constant. By sensing the gate voltage of $Q_3$ instead of the source, the relative size of $Q_3$ to $Q_4$ is not as critical. $Q_4$ is chosen to have a negative gate to source voltage based on the current source $I_2$. This guarantees that $Q_4$ drain to source voltage is positive. If the current source $I_2$ is constant, the output voltage $V_O$ should be equal to $V_{IN}$ at all frequencies, plus or minus some nominal offset.

Figure 2A:
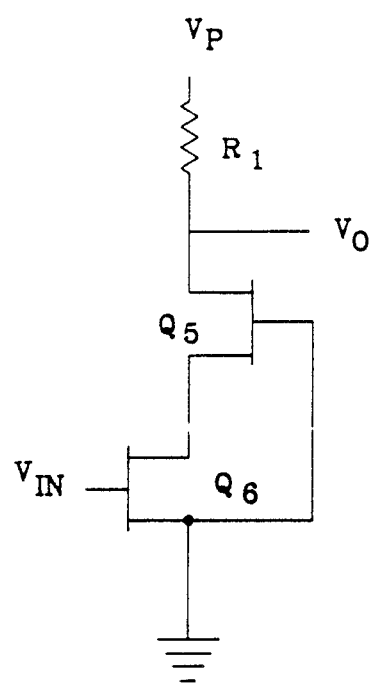
FIG. 2a illustrates an amplifier circuit with drain to source bias control circuitry.
Figure 2B:
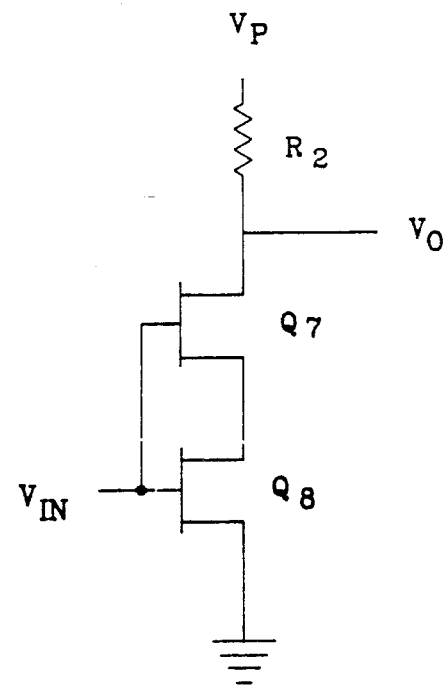
FIG. 2b is an amplifier circuit with drain to gate bias control circuitry.

FIG. 2a shows an amplifier circuit with drain to source bias control circuitry. FIG. 2b shows an amplifier circuit with drain to gate bias control circuitry. The critical component that will dominate the input to output hysteresis error if there is no bias control is $Q_6$ for FIG. 2a and $Q_8$ for FIG. 2b. $Q_5$, FIG. 2a, and $Q_7$, FIG. 2b, controls the biasing of $Q_6$, FIG. 2a, and $Q_8$, FIG. 2b, by sensing the voltage at the source of $Q_5$ for FIG. 2a, and sensing the gate $Q_8$ in FIG. 2b. The drain currents of $Q_6$ and $Q_8$ are controlled by the gate to source voltage of $Q_5$ and $Q_7$, respectively. $V_O$ is the output voltage and $V_{IN}$ is the input voltage.

Figure 3:
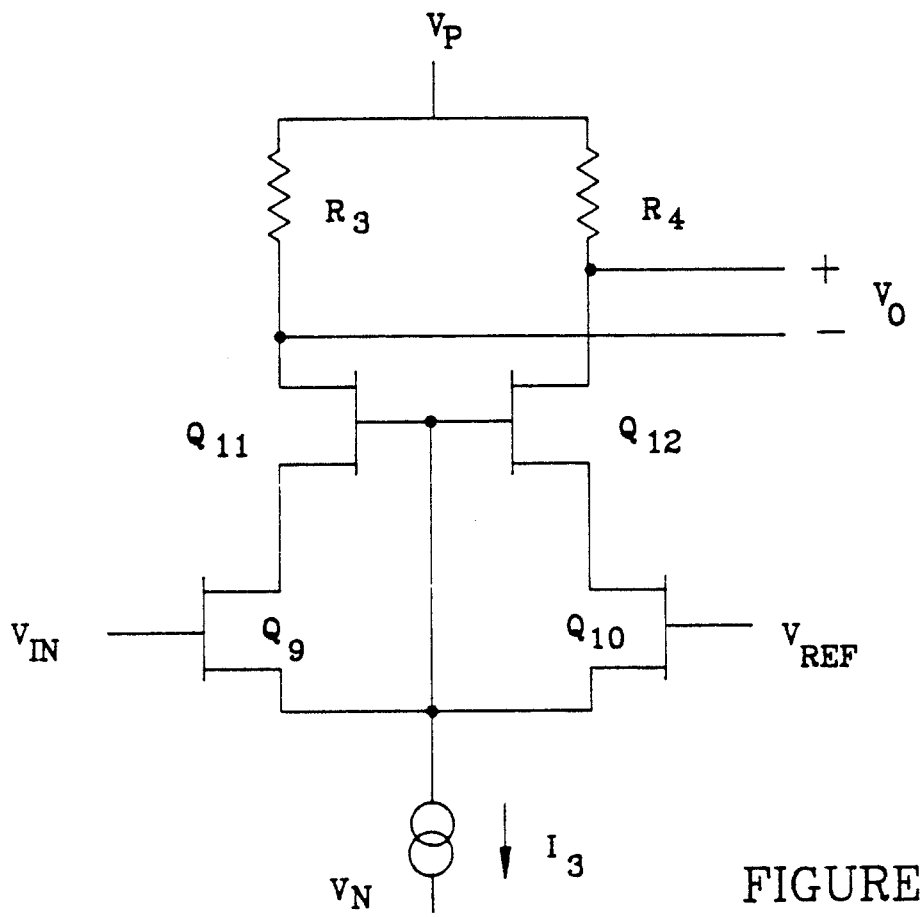
FIG. 3 is a differential amplifier circuit with drain to source bias control circuitry.

FIG. 3 shows a differential amplifier circuit with drain to source bias control circuitry. $Q_9$ and $Q_{10}$ are the critical differential input FETs. $Q_{11}$ and $Q_{12}$ sense the common source voltage of $Q_9$ and $Q_{10}$. $Q_{11}$ controls the drain to source voltage of $Q_9$ and $Q_{12}$ controls the drain to source voltage of $Q_{10}$. The gate to source voltage of $Q_{11}$ and $Q_{12}$ sets the drain to source voltage of $Q_9$ and $Q_{10}$. For the drain to source voltage of $Q_9$ and $Q_{10}$ to be positive, $Q_{11}$ and $Q_{12}$ are selected such that $I_{DSS}$ is two to four times larger than $Q_9$ and $Q_{10}$. $Q_9$ and $Q_{10}$ steers the shared current source $I_3$ into $R_3$ and $R_4$ respectively. The current into $R_3$ and $R_4$ is relative to the difference in the inputs $V_{IN}$ and $V_{REF}$. The differential output voltage $V_O$ is the Voltage difference across $R_3$ and $R_4$.

This circuit controls the hysteresis well for small changes in the differential input voltage ($V_{IN}-V_{REF}$). Gate to source bias control is also necessary for large changes in the differential input voltage.

Figure 4:
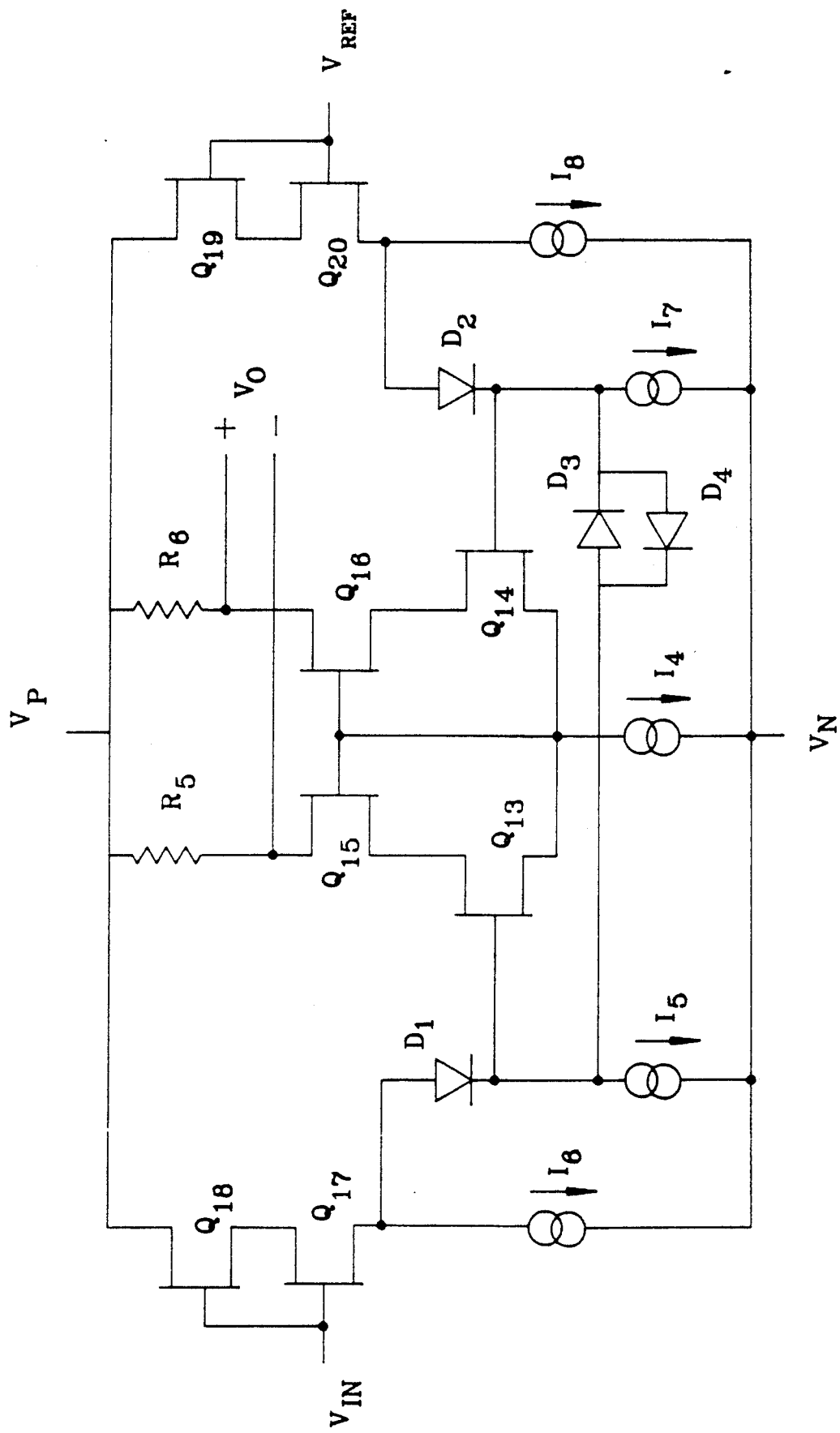
FIG. 4 is a differential amplifier circuit with drain to source bias control and gate to source bias control circuitry.

FIG. 4 shows a differential amplifier with the drain to source bias control and gate to source bias control circuitry. Since the gate to source voltage is controlled, the drain current is also controlled.

$Q_{13}$, $Q_{14}$, $Q_{15}$, $Q_{16}$, $R_5$, $R_6$, and $I_4$ perform the same functions as the equivalent components described in FIG. 3. The inputs $V_{IN}$ and $V_{REF}$ are buffered with a gate to source follower circuit before being applied to the differential amplifier inputs, gate of $Q_{13}$ and $Q_{14}$. The buffer circuit for $V_{IN}$ is comprised of $Q_{17}$, $Q_{18}$, $D_1$, $I_5$ and $I_6$. $Q_{17}$ is the critical input gate to source follower FET. $Q_{18}$ controls the drain to gate voltage, and since the gate to source voltage is relative constant, $Q_{18}$ also controls the drain to source voltage of $Q_{17}$. $I_6$ sets a minimum idle current into $Q_{17}$ for all differential input voltages, $V_{IN}-V_{REF}$. The buffer circuit for $V_{REF}$ is comprised of $Q_{19}$, $Q_{20}$, $D_2$, $I_7$, and $Q_8$. $Q_{20}$ is the critical gate to source follower FET. $Q_{19}$ controls the drain to gate, and drain to source voltage of $Q_{20}$. $I_8$ sets a minimum idle current for $Q_{20}$ for all differential input voltages. For large differences in input voltages, the gate to source voltage of $Q_{13}$ and $Q_{14}$ are clamped together by $D_3$ and $D_4$, as described below.

The input FET $Q_{13}$ or $Q_{14}$ that has the higher gate voltage will be biased relative to the common source of the two FETs. This gate to source voltage will be called $V_{GSC}$. The gates of $Q_{13}$ and $Q_{14}$ are clamped together with $D_3$ and $D_4$. When the voltage at the gate of $Q_{13}$ is much higher than $Q_{14}$, $V_{GS}(Q_{13})=V_{GSC}$ and $V_{GS}(Q_{14})=V_{GSC}+V_D(D_3)$, where $V_{GS}$ is the gate to source voltage and $V_D$ is a forward biased diode drop. When the gate voltage of $Q_{14}$ is much higher than $Q_{13}$, $V_{GS}(Q_{13})=V_{GSC}+V_D(D_4)$ and $V_{GS}(Q_{14})=V_{GSC}$. For large voltage swings, the gate to source voltage of $Q_{17}$ and $Q_{20}$ is kept relatively constant because the large voltage differences will reverse bias $D_1$ and $D_2$. When the voltage at $V_{IN}$ is much larger than $V_{REF}$, the voltage at the gate of $Q_{14}$ is pulled up through $D_1$ and $D_3$. $D_2$ becomes reversed biased when the gate to source voltage of $Q_{20}$ remains relatively constant. When $V_{REF}$ is much larger than $V_{IN}$ the voltage at the gate of $Q_{13}$ is pulled up through $D_2$ and $D_4$. $D_1$ becomes reversed, when the gate to source voltage of $Q_{17}$ remains relatively constant. $D_3$ and $D_4$ can also be replaced with a resistor $R_X$ to reduce the voltage difference between the gates of $Q_{13}$ and $Q_{17}$. The maximum voltage across this resistor $R_X$ is set by the current source $I_5$ or $I_6$, depending on the input voltage ($V_{IN}-V_{REF}$) polarity, where $V_D$ is replaced with $R_X*I_5$ in the above equation, and $I_5=I_6$.

Figure 5:
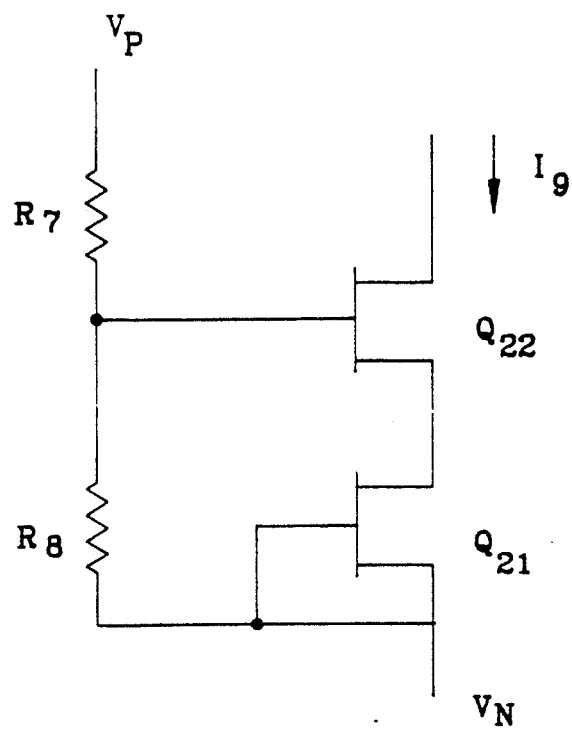
FIG. 5 is a GaAs FET current source with drain to source bias control.

FIG. 5 shows a GaAs FET current source with drain to source bias control. $Q_{21}$ is the current source with the gate to source connected together. $Q_{22}$ controls the drain to source voltage of $Q_{21}$. The resistor divider $R_8/(R_7+R_8)$ sets the voltage at the gate of $Q_{22}$. The drain to source voltage of $Q_{21}$ is equal to $V_{DS}(Q_{21})=V_{GS}(Q_{22})+(V_P-V_N)*R_8/(R_8+R_7)$. The drain to source voltage of $Q_{21}$ will be relatively constant over all frequencies. This will minimize the change in the drain current of $Q_{21}$ at low frequency operation.

What is claimed:

1. A circuit for minimizing the changes in transistor biasing over all frequencies, including field effect transistors having source, drain and gate connections, comprising;
    a first field effect transistor circuit having source drain and gate connections; and
    a second GaAs field effect transistor circuit having gate and source connections, said second GaAs field effect transistor circuit with gate and source connections connected across the source and drain connections of the first field effect transistor respectively;
    wherein the second field effect transistor controls the bias of the first field effect transistor by sensing the voltage at source connection of the first transistor.

2. A circuit for minimizing the changes in transistor biasing over all frequencies, including field effect transistors having source, drain and gate connections, connected as a differential amplifier comprising;
    a first field effect transistor having gate, source and drain connections;
    a second field effect transistor having gate, source and drain connections;
    a first bias control GaAs field effect transistor connected between the source and drain of the first field effect transistor; and
    a second bias control GaAs field effect transistor connected between the source and drain of the second field effect transistor;
    the gate connections of the first and second bias control GaAs field effect transistors are connected together and to the source connections of the first and second field effect transistors; and
    the gate connections of the first and second field effect transistors serving as inputs for the differential amplifier.

3. The circuit according to claim 2, wherein the output of the differential amplifier is across the drain connections of said first and second bias GaAs field effect transistors.

4. The circuit according to claim 2, including first and second buffer circuits connected to the first and second gate connections, respectively, of said first and second field effect circuits.

5. The circuit according to claim 4, wherein said buffer circuits are gate to source follower circuits.

6. The circuit according to claim 4, wherein the buffer circuits include series connected field effect transistors having the gate of each of the series connected field effect transistors connected together.

7. A biasing circuit for minimizing the changes in field effect transistor biasing over all frequencies, each field effect transistor having source, drain and gate connections including:
    a bias control GaAs field effect transistor having gate and source connections connected to a second field effect transistor such that the bias control GaAs field effect transistor gate and source connections are connected between the source and drain of the second field effect transistor respectively;
    wherein the bias control transistor has a gate to source voltage of approximately zero volt.

8. The biasing circuit according to claim 7, wherein the $I_{DSS}$ of the bias control GaAs transistor is approximately twice the $I_{DSS}$ of the second field effect transistor.

9. The method according to claim 7, wherein the second transistor is a gallium arsenide transistor.

10. Biasing and buffer circuits for a differential circuit including two input field effect transistors, said differential amplifier and biasing/buffer circuit comprising:

a first field effect transistor having gate, source and drain connections;

a second field effect transistor having gate, source and drain connections;

a first bias control GaAs field effect transistor connected between the source and drain of the first field effect transistor;

a second bias control GaAs field effect transistor connected between the source and drain of the second field effect transistor;

the source connections of the first and second field effect transistors are connected together; and the gate connections of the first and second bias GaAs field effect transistors are connected together and to the source connections of the first and second field effect transistors.

11. The circuit according to claim 10, wherein the output of the differential circuit is across the drain connections of said first and second bias GaAs field effect transistors.

* * * * *